(12) United States Patent
Sakamoto et al.

(10) Patent No.: US 11,046,190 B2
(45) Date of Patent: Jun. 29, 2021

(54) PRESSING MEMBER (71) Applicant: DENSO CORPORATION, Kariya (JP)

(72) Inventors: Kazuki Sakamoto, Kariya (JP); Hideaki Tachibana, Kariya (JP); Hiroki Umeda, Toyota (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/833,856

(22) Filed: Mar. 30, 2020

(65) Prior Publication Data

US 2020/0307387 A1 Oct. 1, 2020

(30) Foreign Application Priority Data

Mar. 28, 2019 (JP) .............................. JP2019-063162

(51) Int. Cl.
| | |
|---|---|
| *H02B 1/56* | (2006.01) |
| *H05K 7/20* | (2006.01) |
| *B60L 15/00* | (2006.01) |
| *H02M 7/00* | (2006.01) |
| *H01L 23/40* | (2006.01) |

(52) U.S. Cl.
CPC ........... *B60L 15/007* (2013.01); *H02M 7/003* (2013.01); *H01L 23/40* (2013.01); *H05K 7/209* (2013.01)

(58) Field of Classification Search
None
See application file for complete search history.

(56) References Cited

U.S. PATENT DOCUMENTS

| | | | | |
|---|---|---|---|---|
| 4,636,917 A | * | 1/1987 | Jouanny | H01L 23/4012 361/709 |
| 8,929,097 B2 | * | 1/2015 | Nakasaka | H01L 25/112 361/831 |
| 9,105,597 B2 | * | 8/2015 | Hironaka | H01L 21/52 |
| 9,530,750 B2 | * | 12/2016 | Fishman | H01L 24/72 |
| 2006/0226450 A1 | * | 10/2006 | Furuta | H01L 25/117 257/208 |
| 2013/0003301 A1 | * | 1/2013 | Miyamoto | H02M 7/003 361/699 |
| 2016/0079145 A1 | * | 3/2016 | Nakagawa | G06F 1/20 361/699 |
| 2016/0086873 A1 | * | 3/2016 | Sano | H01L 23/36 257/714 |
| 2018/0366390 A1 | * | 12/2018 | Mizushiri | H01L 23/40 |
| 2020/0161213 A1 | * | 5/2020 | Yamaura | H01L 25/074 |

FOREIGN PATENT DOCUMENTS

JP  2014-011935 A  1/2014

* cited by examiner

*Primary Examiner* — Courtney L Smith
(74) *Attorney, Agent, or Firm* — Oliff PLC (57) ABSTRACT

A pressing member is used for pressing semiconductor modules and cooling pipes which are alternately disposed, and includes a plate and an elastic member. The plate includes a contact plate section that faces an end surface of the fixed unit in the fixed direction and contacts with the end surface of the fixed unit, and plate ribs standing in the fixed direction from an end portion of the contact plate section in a width direction of the contact plate section. The elastic member is disposed in a side of the plate opposite to a side of the plate where the fixed unit is disposed, the elastic member pressing the plate towards a fixed unit side in the fixed direction. The contact plate section has an inner plate surface including a concave surface formed at a portion apart from the plate ribs in a contact region.

4 Claims, 12 Drawing Sheets

PRESSING MEMBER

CROSS-REFERENCE TO RELATED APPLICATION

This application is based on and claims the benefit of priority from earlier Japanese Patent Application No. 2019-63162 filed Mar. 28, 2019, the description of which is incorporated herein by reference.

BACKGROUND

Technical Field

The present disclosure relates to pressing members.

Description of the Related Art

For electric vehicles or hybrid vehicles, power conversion apparatus such as inverters are mounted thereon. The power conversion apparatus includes semiconductor modules and cooling pipes which constitute a stack unit with a pressing member.

SUMMARY

The present disclosure provides a pressing member capable of suppressing deformation of a plate. One aspect of the present disclosure is a pressing member pressing a fixed unit, where an electronic component constituting a part of a power conversion circuit and a cooling pipe cooling the electronic component are alternately disposed, in a fixed direction of the fixed unit.

DETAILED DESCRIPTION OF THE PREFERRED EMBODIMENTS

According to a conventional apparatus, for example, Japanese Patent Laid-Open Publication No. 2014-11935 discloses a power conversion apparatus configured of a stack in which a semiconductor module constituting a power conversion circuit and a cooling pipes are stacked, and a pressing member that presses the stack in the stack direction. The pressing member is disposed in a rear side which is one end side in the stack direction of the stack, pressing the stack towards a front side opposite to the rear side in the stack direction. Thus, the semiconductor module and the cooling pipes are closely fitted to each other, thereby improving the cooling efficiency.

The pressing member according to the above-described patent literature includes an elastic member and a plate. The elastic member is composed of a plate spring, applying pressing force to the stack in the stack direction. The plate is disposed between the stack and the elastic member. The plate includes a contact plate section facing and contacting with the rear surface of the cooling pipe disposed in the rear end of the stack, and a pair of plate rib sections standing towards a rear side from both ends of the contact plate section in the width direction. The plate is provided in order to apply the pressing force of the pressing member to the stack from the rear face of the cooling pipes disposed in the rear end of the stack in the stack direction. Thus, the whole part of the stack is pressed equally in the stack direction. As a result, the semiconductor module is entirely cooled equally.

However, according to the plate of the pressing member disclosed in the above-described patent literature, a portion being adjacent to the plate rib sections in the contact plate section has relatively high rigidity, while a portion not being adjacent to the plate rib sections in the contact plate section has relatively low rigidity. Nevertheless, the elastic member of the pressing member equally presses the portion being adjacent to the plate rib portions in the contact portion (i.e. both end portions of the contact plate section in the width direction) and the portion not being adjacent to the plate rib portions in the contact plate section (i.e. center portion of the contact plate section in the width direction). Hence, the portion not being adjacent to the plate rib portions in the contact plate section may be plastically deformed. In this case, the pressing force on the rear face of the cooling pipes from the pressing member is concentrated at a part of the rear face of the cooling pipes, and thus the whole of the stack cannot be pressed equally. As a result, uneven of the cooling may occur on the semiconductor module.

In light of the above-described circumstance, hereinafter, embodiments of the present disclosure will be described.

First Embodiment

With reference to FIGS. 1 to 9, embodiments of a pressing member and a power conversion apparatus provided with the pressing member will be described.

Figure 8:
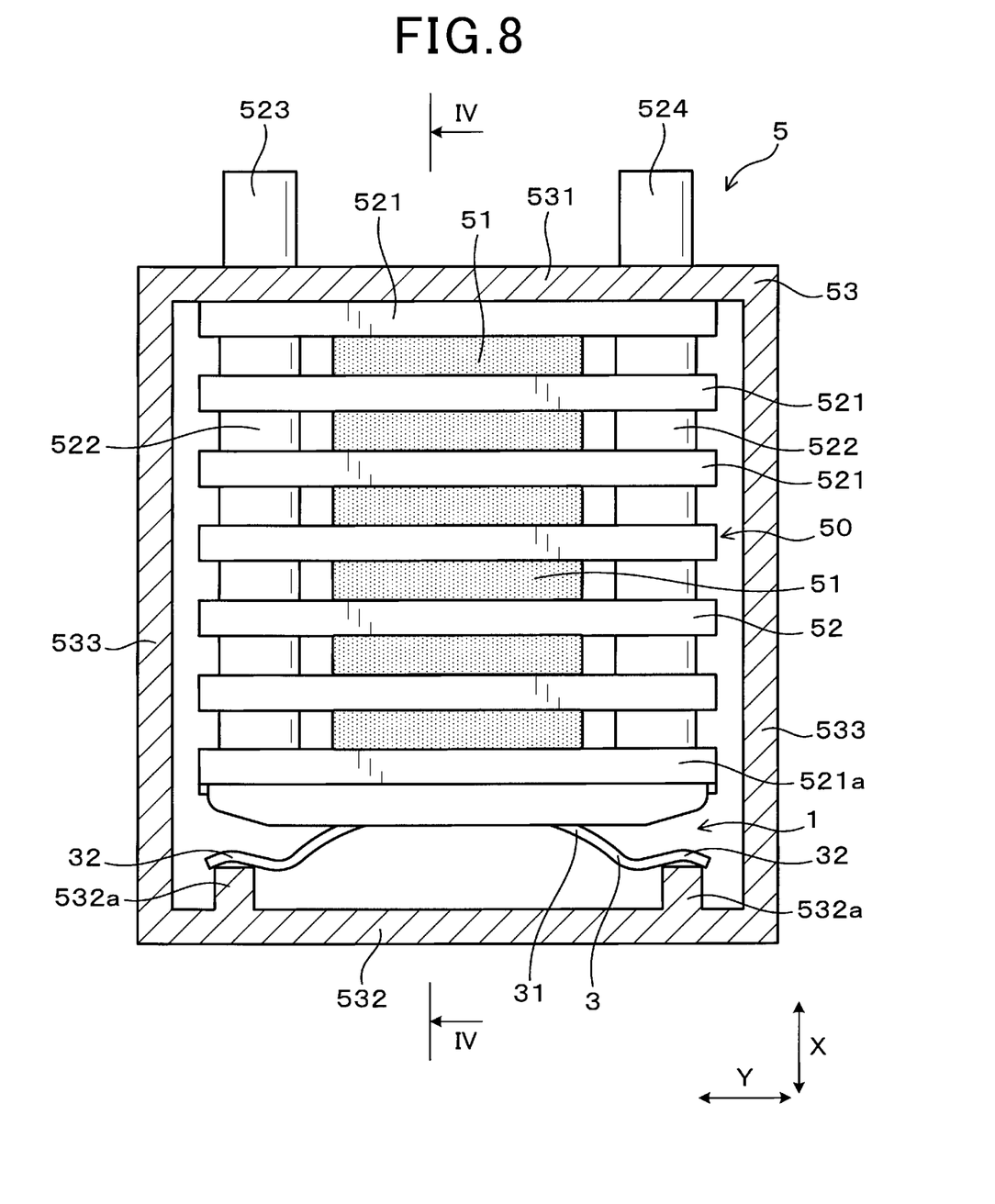
FIG. 8 is a plan view of a power conversion apparatus according to the first embodiment.
Figure 9:
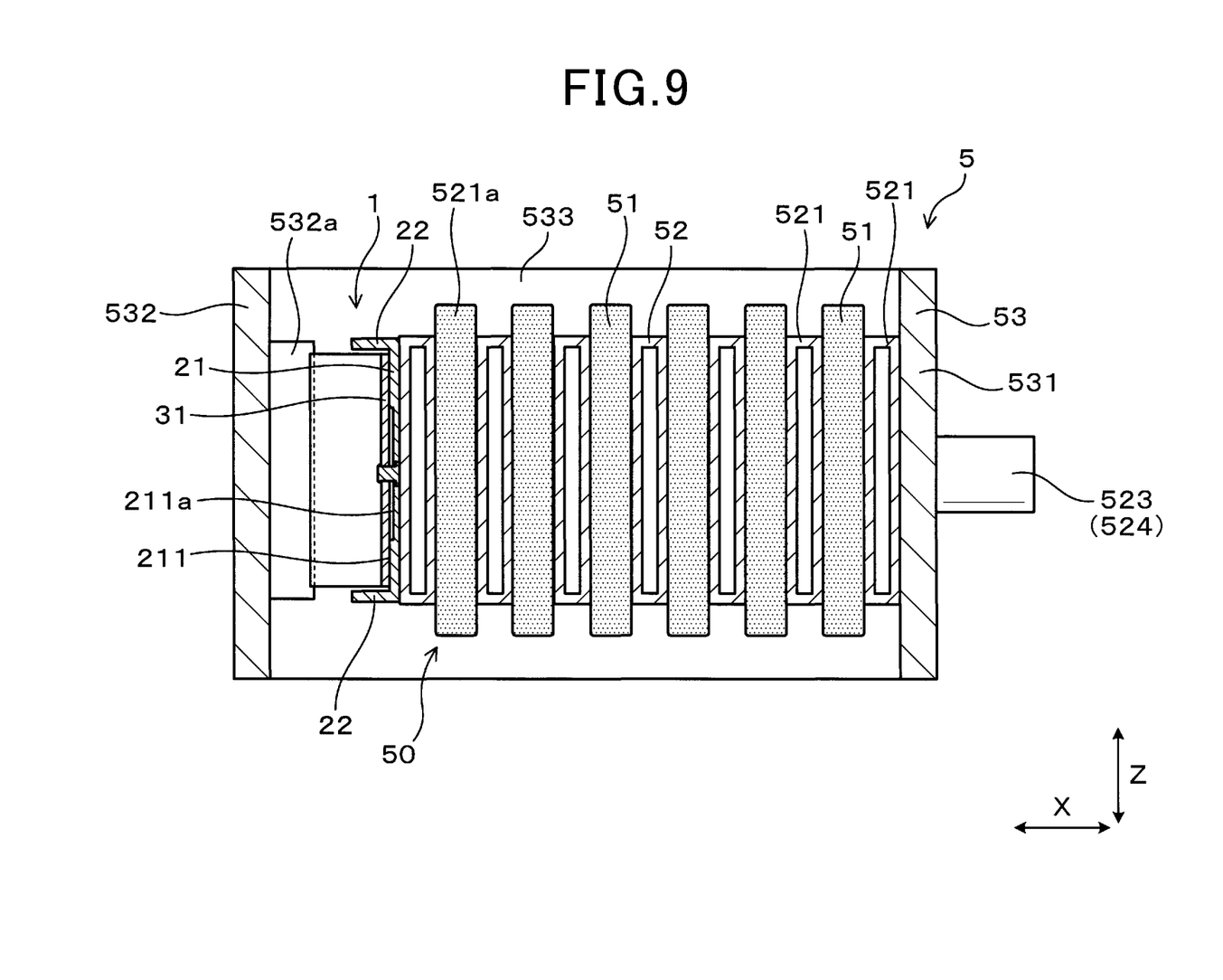
FIG. 9 is a cross-sectional view of the power conversion apparatus shown in FIG. 8, which is sectioned along a line IV-IV of FIG. 8.

As shown in FIGS. 8 and 9, a pressing member 1 according to the first embodiment is used for pressing a fixed unit 50 in which a semiconductor module 51 as an electronic component which constitutes a part of the power conversion apparatus and a cooling pipe 521 are alternately disposed in a fixed direction (hereinafter referred to as X-direction).

Hereinafter, a forward direction (or front side) is defined as a one side direction of the X-direction along which the pressing member 1 presses the fixed unit 50, and a direction opposite to the one side direction is defined as a rear direction (or rear side). Note that front and rear directions are defined as sake of convenience, and do not limit the orientation of the pressing member 1 and the power conversion apparatus 5 with respect to a vehicle on which the pressing member 2 and the power conversion apparatus provided with the pressing member 1 are mounted.

The pressing member 1 is provided with a plate 2 and an elastic member 3. The plate 2 includes a contact plate section 21 that faces the rear face of the fixed unit 50 and contacts therewith, and a plate rib 22 standing in the X direction from an end portion of the contact plate section 21 in a width direction (hereinafter referred to as Z direction) of the contact plate section 21. The elastic member 3 is disposed in the rear side of the plate 2 and presses the plate 2 in the forward direction.

As shown in FIGS. 2, 4 to 6, an inner plate surface 211 is provided as a rear surface of the contact plate section 21. The inter plate surface 211 is formed at a portion apart from the plate rib 22 in a contact region R positioned between a contact plate section 21 and the elastic member 3 in the longitudinal direction (hereinafter referred to as Y direction) of the contact plate section 21. The inter plate surface 21 is provided with a concave surface 211a that faces the elastic member 3 via a gap in the X direction. Note that the contact region R includes at least a region contacting with the contact plate section 21 and the elastic member 3 in a state where the pressing member 1 is being attached to the power conversion apparatus 5. Hereinafter, the first embodiment will be described in more detail.

Figure 2:
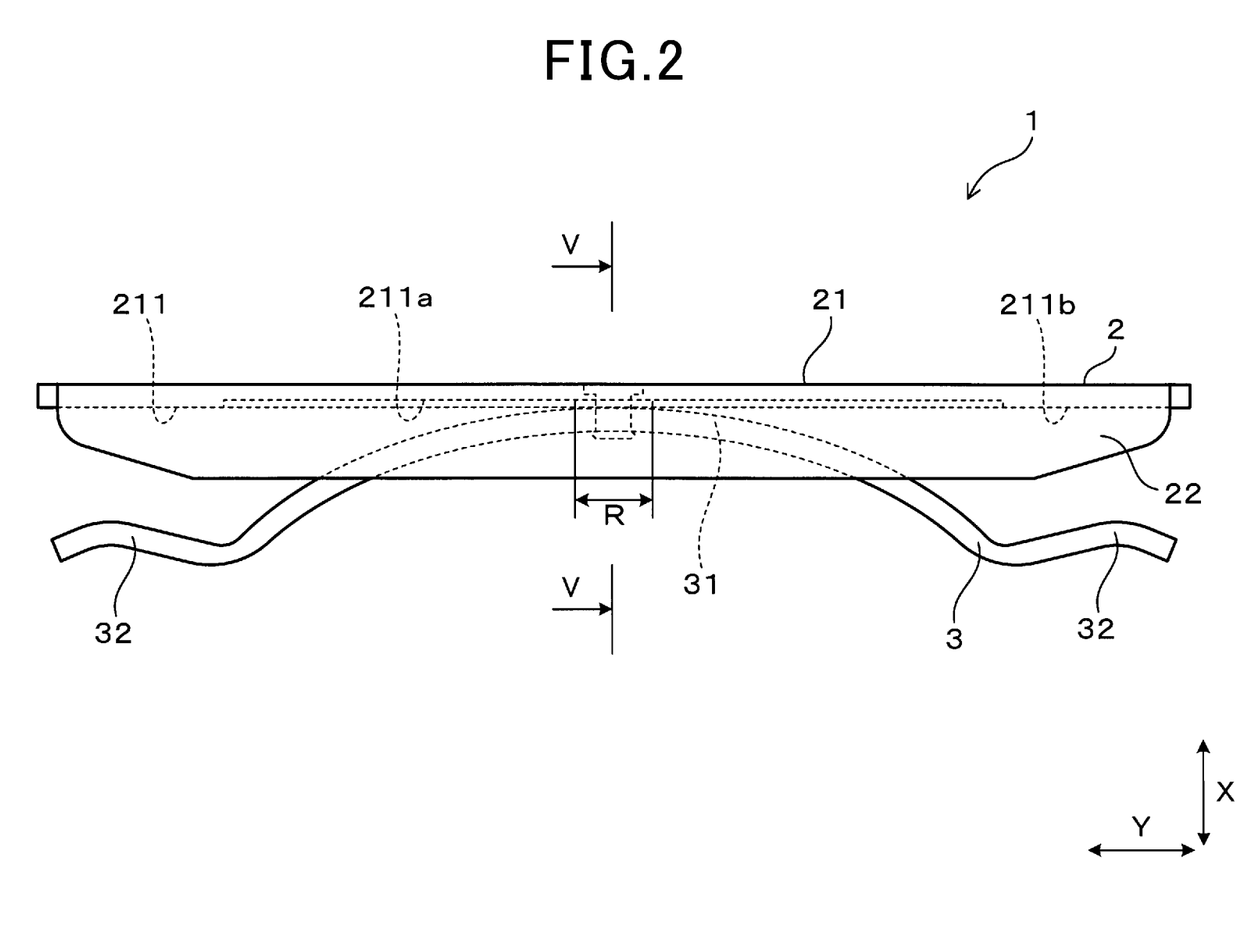
FIG. 2 is a plan view showing the pressing member of the first embodiment.
Figure 3:
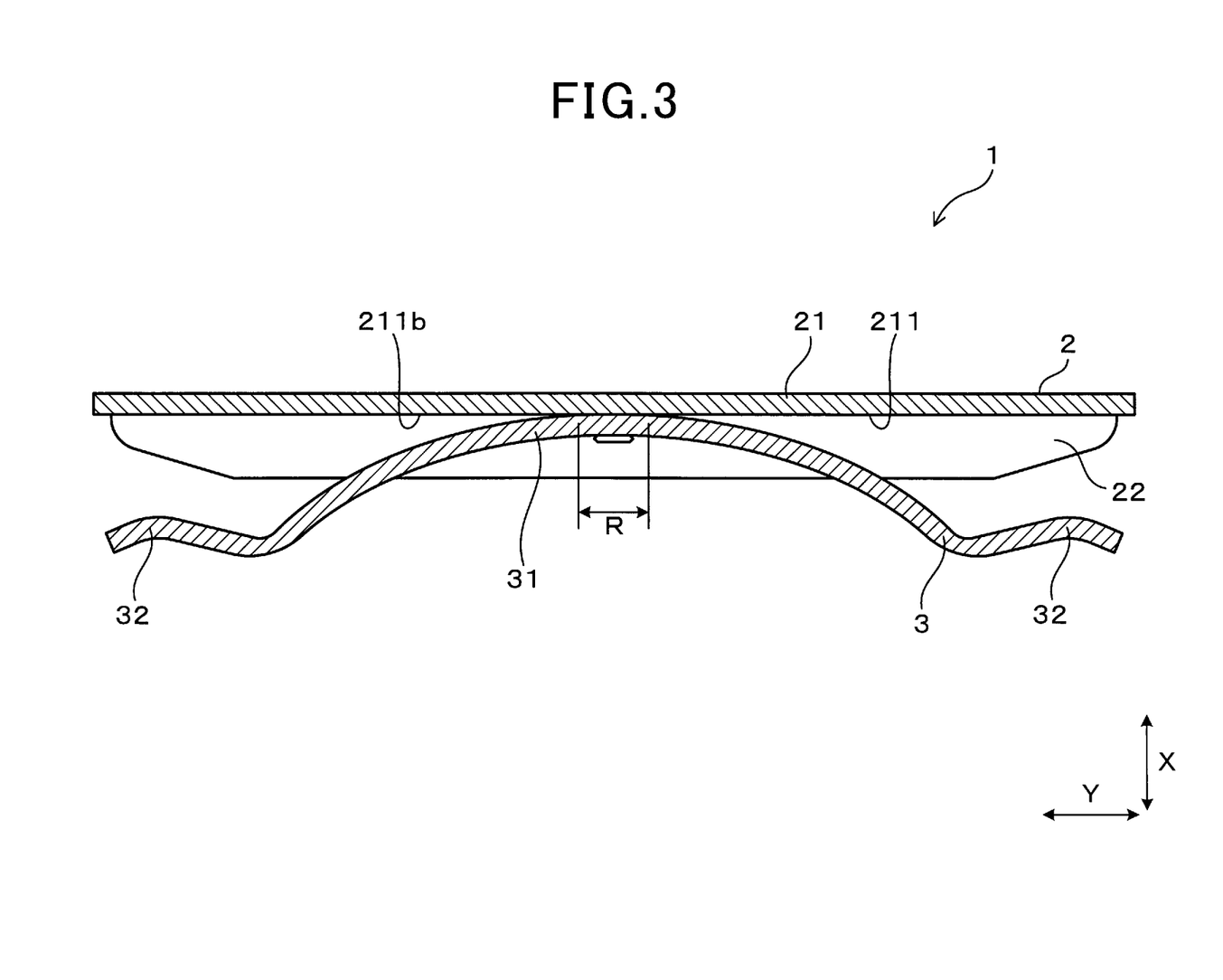
FIG. 3 is a cross-sectional view showing a cross section of the pressing member sectioned along a plane orthogonal to the Z-direction, not passing through a concave surface.
Figure 4:
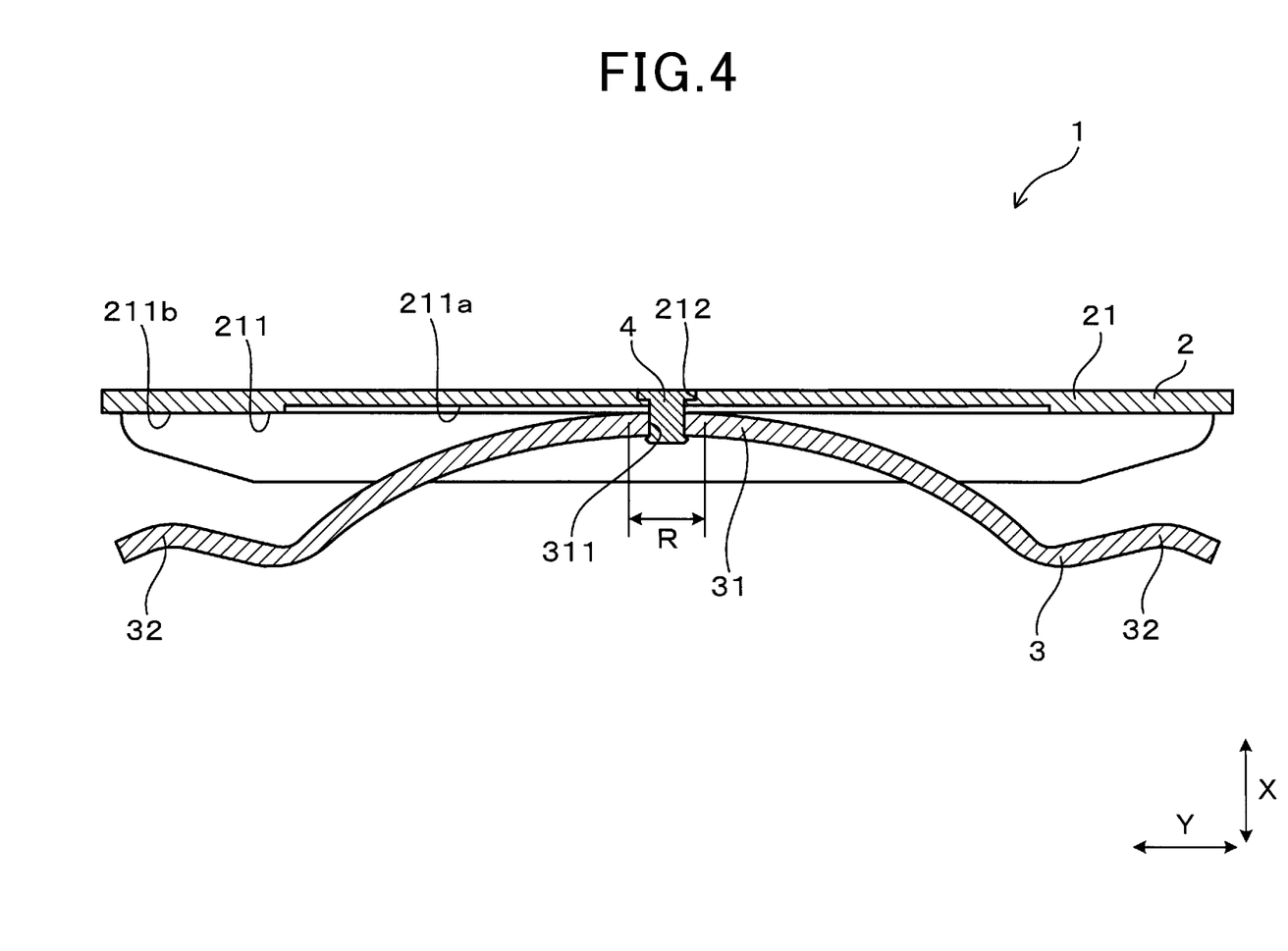
FIG. 4 is a cross-sectional view showing a cross section of the pressing member sectioned along a plane orthogonal to the Z-direction, passing through the concave surface.

The elastic member 3 and the plate 2 of the pressing member 1 is made of metal such as a carbon tool steel. As shown in FIGS. 2 to 4, the elastic member 3 is a plate spring made of a single sheet metal. The elastic member 3 includes a pressing portion 31 in which the center portion is bent in an arc shape towards the forward direction and a supported portion 32 formed in the both sides of the pressing portion 31 and bent towards a direction as same as that of the pressing portion 31.

The pressing portion 31 contacts with the contact plate section 21 and press the contact plate section 21 towards the forward direction. As shown in FIG. 8, the supported portion 32 is supported by a support portion 532a of a frame 53 (described later) of the power conversion apparatus 5. As shown in FIGS. 2 to 4, the plate 2 is disposed to contact with a portion, as a substantial center portion of the pressing portion 31 in the Y direction, protruding towards the most front position of the pressing portion 31.

Figure 1:
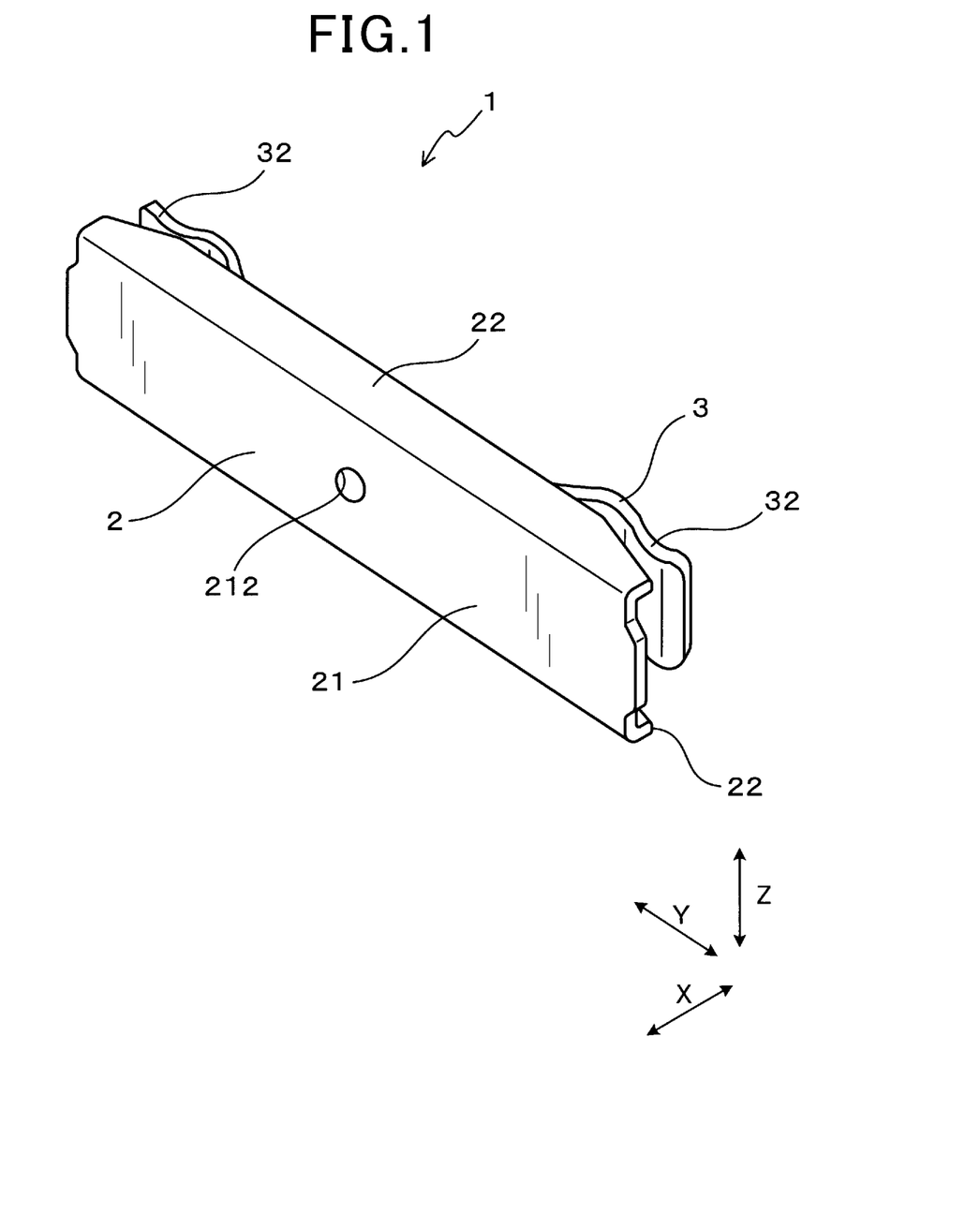
FIG. 1 is a perspective view showing a pressing member of a first embodiment according to the present disclosure.
Figure 6:
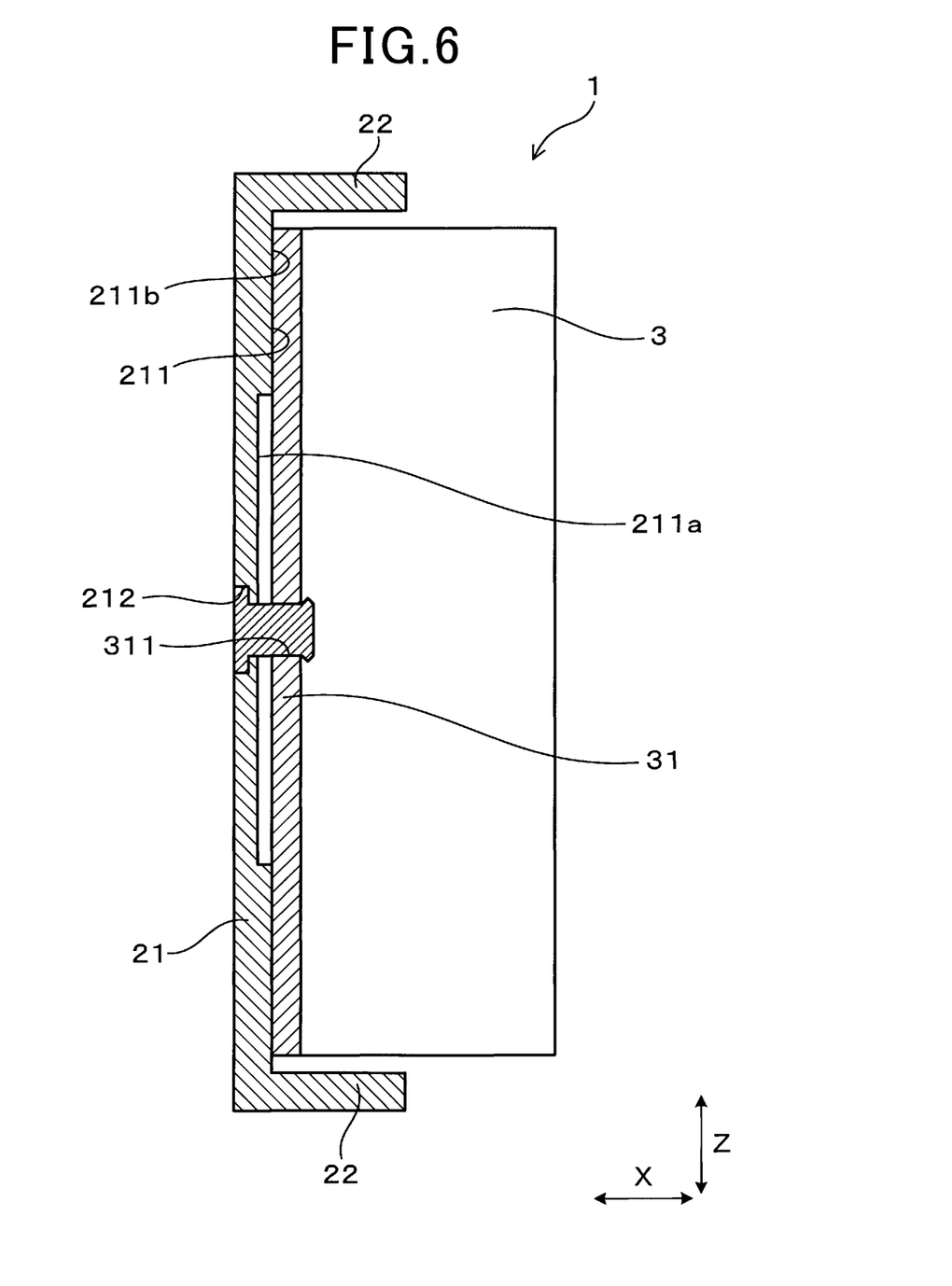
FIG. 6 is a cross-sectional view of the pressing member shown in FIG. 2, which is sectioned along a line V-V of FIG. 2.

As shown in FIGS. 1 and 6, the plate 2 has a shape formed by bending a single metal sheet in a U shape. In other words, the plate 2 has a thickness side in the X direction and a shape in which both end portions of a single metal plate are bent in the Z direction, the single metal plate having a longitudinal side in the Y direction. As described above, the plate 2 includes the contact plate section 21 and the plate rib 22.

Figure 7:
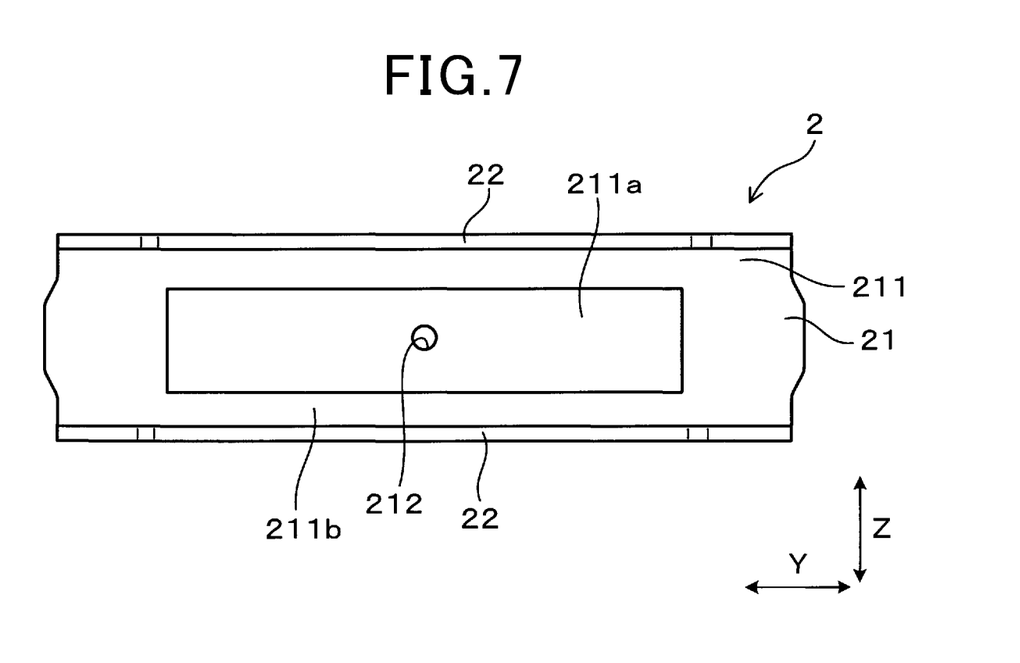
FIG. 7 is a rear view of a plate according to the first embodiment.

The contact plate section 21 is formed as a plate having a thickness side in the X direction. As shown in FIG. 7, the contact plate section 21 is formed having a longitudinal side in the Y direction. As shown in FIGS. 2 to 4, the contact plate section 21 is disposed in the front side of the elastic member to face the elastic member 3 in the X direction.

As shown in FIG. 7, the inner plate surface 211 includes a base surface 211b and a concave surface 211a caved in the forward direction from the base surface 211b. The concave surface 211a is formed at a center portion of the contact plate section 21 in the Z direction. The concave surface 211a is formed at a portion apart from a pair of rib portions 22. Also, the concave surface 211a is formed at a center portion in the Y direction. The base surface 211b is formed in an annular shape surrounding the concave surface 211a. The concave surface 211a of the contact plate section 21 can be formed by cutting only a portion corresponding to the concave portion 211a in a plate shaped member that constitutes the contact plate section 21.

As shown in FIGS. 3, 4 to 6, the center portion of the pressing portion 31 of the elastic member 3 contacts with the center portion of the base surface 211b of the contact plate section 21. As shown in FIG. 6, the pressing portion 31 of the elastic member 3 contacts, in the both end portions in the Z direction, with the base surface 211b formed at both sides of the concave surface 211a in the Z direction. The center portion of the pressing portion 31 of the elastic member 3 faces the concave surface 211a with a gap in the X direction.

Figure 5:
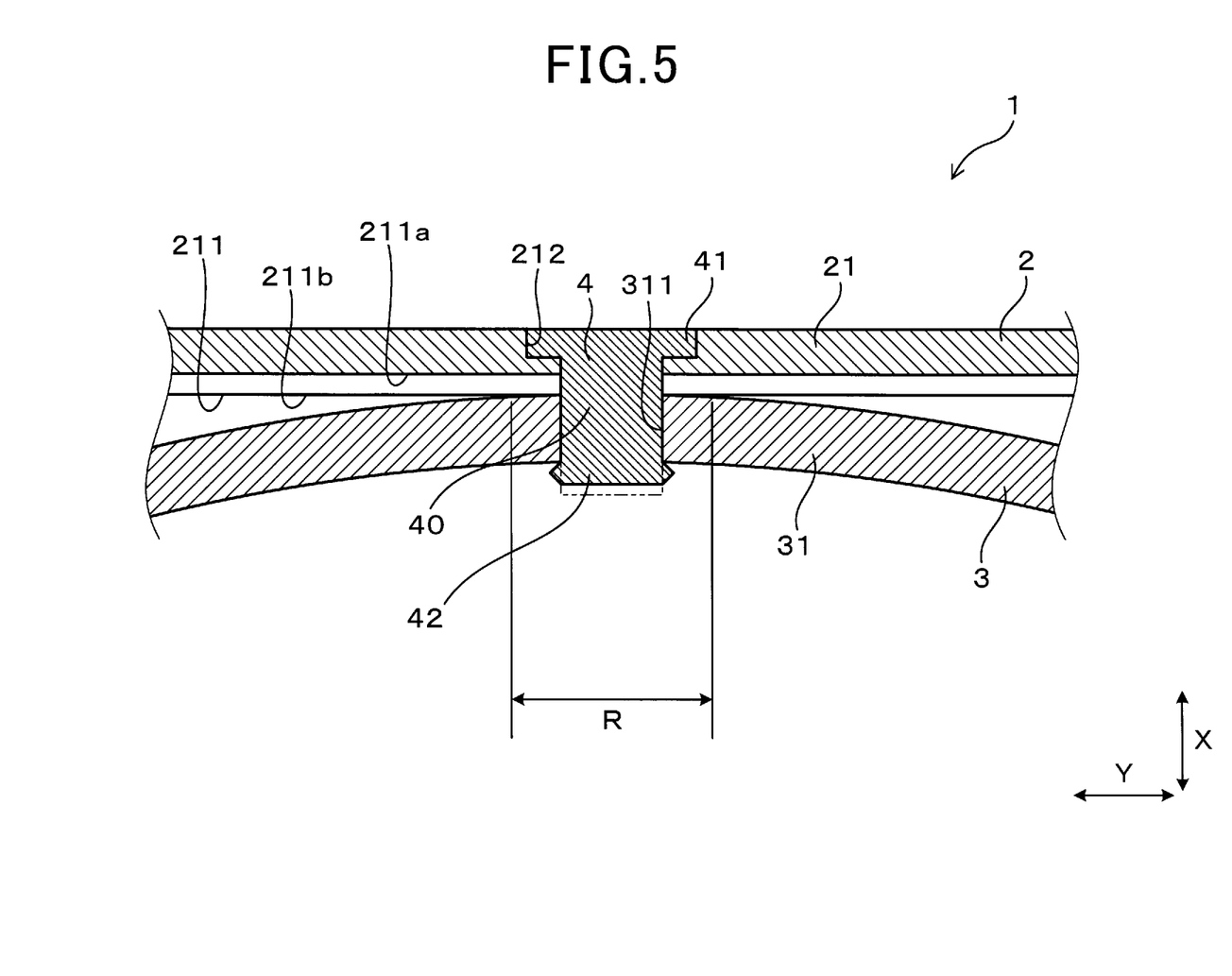
FIG. 5 is an enlarged view in the vicinity of a fixing metal member shown in FIG. 4.

As shown in FIGS. 4 and 5, the concave portion 211a is formed extending to both outer sides of the contact region R at which the elastic member 3 contacts with the contact plate section 21. In other words, the contact region R is provided to be within the concave surface 211a.

As shown in FIG. 1, FIGS. 4 to 7, a plate side through hole 212 that penetrates the contact plate section 21 in the X direction is formed in the center portion of the contact plate section 21 when viewed from the X direction. Also, as shown in FIG. 7, the plate side through hole 212 is located at the center of the concave surface 211a when viewed from the X direction. As shown in FIGS. 4 to 7, the plate side through hole 212 is formed to have a step shape such that the diameter in the front side is larger than the diameter in the rear side.

As shown in FIGS. 4 to 6, a spring side through hole 311 that penetrates in the X direction is formed at the center portion of the elastic member 3 when viewed from the X direction. The spring side through hole 311 is formed at a portion protruding towards the most front side. The plate side through hole 212 and the spring side through hole 311 are provided in a position overlapping from each other. The elastic member 3 and the plate 2 are mutually fixed by a fixing metal member fitting 4 which is inserted between the plate side through hole 212 and the spring side through hole 311.

As shown in FIG. 5, the fixing metal member fitting 4 includes a cylindrical portion 40 formed in the center portion in the X direction and a flange portion 41 formed in a front area of the cylindrical portion 40 and a caulking portion 42 formed in a rear area of the cylindrical portion. The cylindrical portion 40 is engaged with the plate side through hole 212 having a step shape. Thus, the fixing metal member fitting 4 is configured not to fall out towards the rear side from the plate side through hole 212 and the spring side through hole 311. The front surface of the flange portion 41 is flush with the front surface of the contact plate section 21, or is formed to be in a rear side portion with respect to the front surface.

Further, the calking portion 42 protrudes towards the rear side from the spring side through hole 311 and the diameter thereof is larger than that of the spring side through hole 311. Thus, the fixing metal member fitting 4 is configured not to fall out towards the front side from the plate side through hole 212 and the spring side through hole 311. Then, the contact plate section 21 and the elastic member 3 are fixed by the caulking member 42 to be sandwiched between the flange portion 41 in the caulking portion 42 and the caulking portion 42.

The caulking portion 42 before being processed is formed in a cylindrical shape having the same diameter as that of the cylindrical portion 40 as indicated by two dots chain line shown in FIG. 5. Then, the rear surface of the caulking portion 42 is hammered to be expanded, thereby making the outer diameter of the caulking portion 42 be larger than that of the spring side through hole 311.

As shown in FIGS. 1, 6 and 7, the plate rib 22 are formed extending towards rear side, at each of the both sides of the contact plate section 21 in the Z direction. That is, a pair of plate ribs 22 are formed in the pressing member 1. The plate ribs 22 are formed at edge portions of the contact plate section in the Z direction in the entire portions in the Y direction. Each of the plate ribs 22 has a thickness in the Z direction and has the longitudinal side in the Y direction. The pair of ribs 22 face each other in the Z direction.

The length of the short direction (i.e. X direction) of each plate rib 22 is shorter than that of the short direction (Z direction) of the contact plate section 21. The plate ribs 22 are formed at portions overlapping a part of the elastic member 3 in the Z direction.

Next, with reference to FIGS. 8 and 9, a power conversion apparatus 5 provided with the pressing member 1 according to the present embodiment will be described.

For example, the power conversion apparatus 5 is mounted on an electric vehicle or a hybrid vehicle, and may serve as a converter that converts the power between a DC power source and a three phase AC rotary electric machine as a drive source of the vehicle.

The power conversion apparatus 5 is provided with the fixed unit 50 in which the semiconductor modules 51 that constitute a part of the power conversion circuit, and the cooling pipe 521 that cool the semiconductor module 51 are alternately disposed in the X direction, and the pressing member 1 that presses the fixed unit 50 in the X direction. Further, the power conversion apparatus 5 includes a frame 53 that accommodates the fixed unit 50 and the pressing unit 1 inside the frame 53.

The semiconductor 51 is configured such that switching elements such as IGBT (i.e. Insulated Gate Bipolar Transistor) and diodes such as FWD (i.e. Free Wheel Diode) are sealed with resin. The semiconductor module 51 produces heat caused by the current flowing through semiconductor elements and the like. The semiconductor module 51 is formed in a plate having a thickness in the X direction. The semiconductor module 51 is supported by the cooling pipes 521 from both side in the X direction. Thus, the semiconductor module 51 is cooled from both sides thereof.

Although illustration is omitted, grease is filled between the cooling pipes 521 and the semiconductor modules 51 in order to improve the thermal conductivity therebetween. The grease prevents the thermal conductivity from being lowered between each semiconductor module 51 and each cooling pipe 521 due to presence of the gap between the semiconductor module and the cooling pipe.

The cooling pipe 521 has longitudinal side in the Y direction and has thickness in the X direction. The plurality of cooling pipes are arranged in the X direction at predetermined intervals. The semiconductor module is disposed at a space between cooling pipes 521 located adjacently in the X direction.

As shown in FIG. 8, the cooling pipes 521 adjacently located to each other are coupled via a coupling pipe 522 at the both end portions to constitute a single cooling unit 52.

The cooling unit 52 is made of metal having good thermal conductivity such as aluminum.

An introduction pipe 523 that introduce the coolant into the cooling unit 52, and an exhaust pipe 524 that exhausts the coolant from the cooling unit 52 are coupled to the both end portions in the Y direction of the cooling pipe 521 disposed at the front end of the cooling unit 52. The introduction pipe 523 and the exhaust pipe 524 are formed to protrude in the fixed direction X. The cooling unit 52 is made of metal having good thermal conductivity such as aluminum.

The coolant introduced into the cooling unit 52 from the introduction pipe 523 passes through the coupling pipe 522 and is distributed to the respective cooling pipes 521 where the coolant flows in the longitudinal direction. Then, the coolant exchanges heat with the semiconductor modules 51 while flowing through the respective cooling pipes 521. The coolant of which the temperature has increased due to the heat exchange passes through the coupling pipe 522 in the down stream side, and led to the exhaust pipe 524, thereby being exhausted from the cooling unit 52.

As the coolant, for example, natural coolant such as water and ammonia, water containing ethylene glycol based anti-freeze fluid, fluorocarbon based coolant such as Fluorinert (registered trade mark), chlorofluorocarbon based coolant such as HCFC123 and HC134a, alcohol based coolant such as methanol and alcohol, or ketone based coolant such as acetone can be employed.

The fixed unit 50 is surrounded by the frame 53 from the both sides in the X direction and the Y direction. The frame 53 includes a front wall portion 531, a rear wall portion 532 and a pair of side wall portions 533.

As shown in FIGS. 8 and 9, the front wall portion 531 faces and contacts the front surface of the cooling pipe 521 located at the most front side of the fixed unit 50. The front wall portion 531 supports the fixed unit 50 with the pressing member 1 between the front wall portion 521 and the pressing member 1. Thus, the front wall portion 531 serves as a portion receiving the pressing force.

The rear wall portion 532 faces the front wall portion 531 and is provided in the rear side of the fixed unit 50. The pressing member 1 is provided between the fixed unit 50 and the rear wall portion 532. The rear wall portion 532 supports the pressing member 1.

As shown in FIG. 8, the pair of wall portions 533 couples both end portions of the front wall portion 531 and the rear wall portion 532 in the X direction. The pair of wall portions 533 are disposed in the both sides of the fixed unit 50 in the Y direction.

In the rear wall portion 532, a pair of support portions 532a that protrudes in the front side is formed. The pair of support portions 532a support the pair of support portion 32 from the rear side.

The pressing member 1 is disposed between the pair of support portions 532a of the rear wall portion 532 and the cooling pipe 521 disposed in the rear end of the cooling unit 52. The front surface of the contact plate section 21 of the pressing member 1 surface-contacts with the rear surface of the rear cooling pipe 521a. As shown in FIG. 9, the dimension in the Z direction of the front surface of the contact plate section 21 is the same as the dimension in the Z direction of rear surface of the rear cooling pipe 521a. As shown in FIG. 8, the dimension in the Y direction of the front surface of the contact plate section 21 is the same as the dimension in the Y direction of the rear surface of the rear cooling pipe 521a. The substantially entire front surface of the contact plate section 21 contacts with the substantially entire rear surface of the rear end cooling pipe 521a.

In the power conversion apparatus 5, the elastic member 3 of the pressing member 1 is disposed between the contact plate section 21 and the pair of support portions of the rear wall portion 532a. Thus, the restoring force of the elastic member 3 influences the fixed unit 50 via the contact plate section 21. The fixed unit 50 is disposed between the pressing member 1 and the front wall portion 531, and compressed in the X direction by the pressing force by the pressing member 1. Thus, the semiconductor module 51 and the cooling pipe 521 are closely fitted to each other, thereby improving the cooling efficiency of the semiconductor module 51.

Next, effects and advantages of the present embodiment will be described.

In the present embodiment, the inner plate surface 211 of the contact plate section 21 includes a concave surface 211a that faces the elastic member 2 in the X direction. The concave surface 211a is formed at a portion apart from the plate ribs 22 in the contact region R where the contact plate portion 21 contacts with the elastic member 3. Thus, a portion apart from the plate ribs 22 in the contact plate section 21, that is, a portion having relatively low rigidity in the contact plate section 21, can be prevented from being affected by the pressing force of the elastic member 3. Therefore, the plate can be prevented from being deformed.

Figure 11:
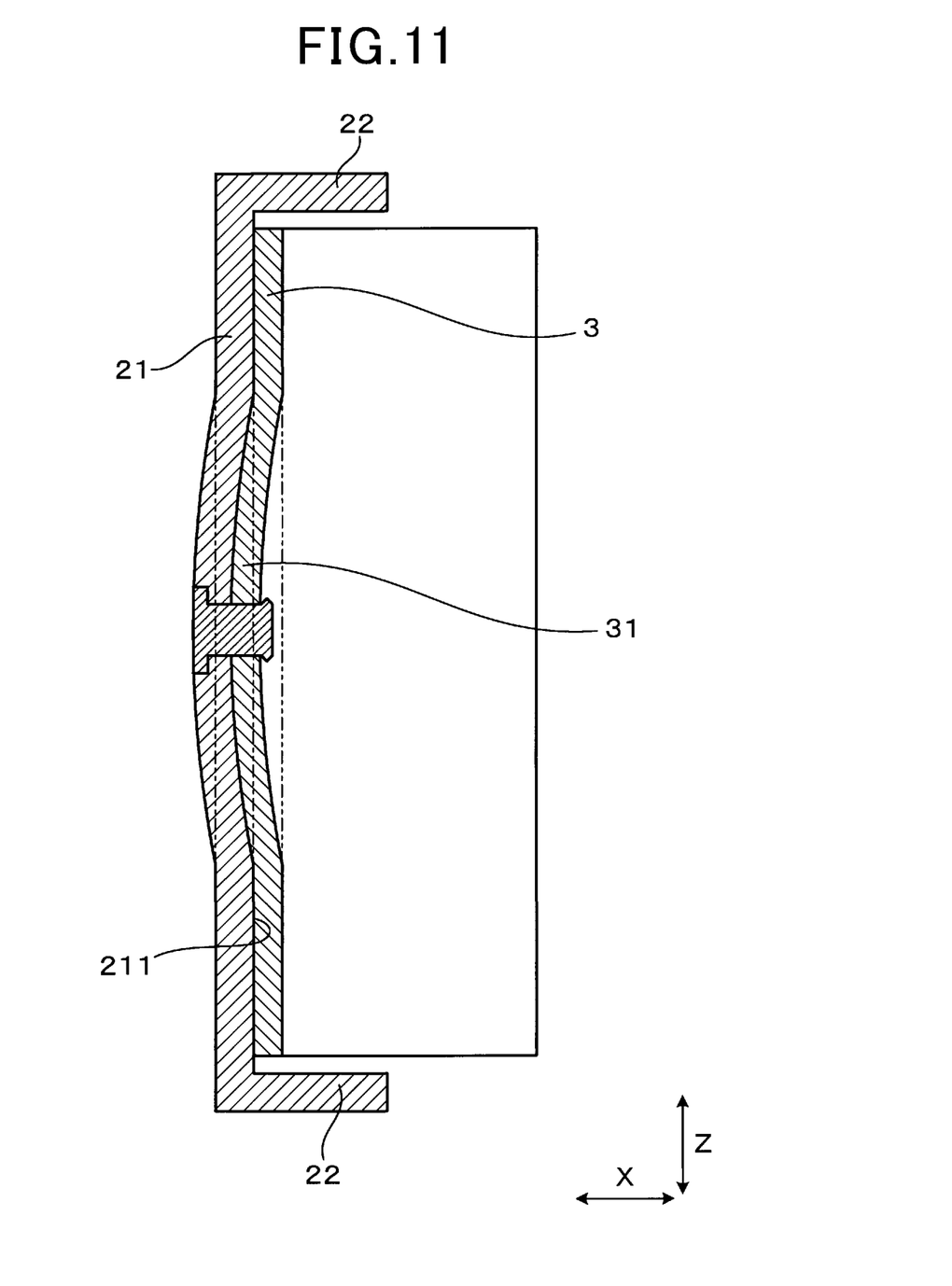
FIG. 11 is a cross-sectional view corresponding to FIG. 6 in a comparative example, which is sectioned along a plane orthogonal to the Y-direction of the pressing member.
Figure 12:
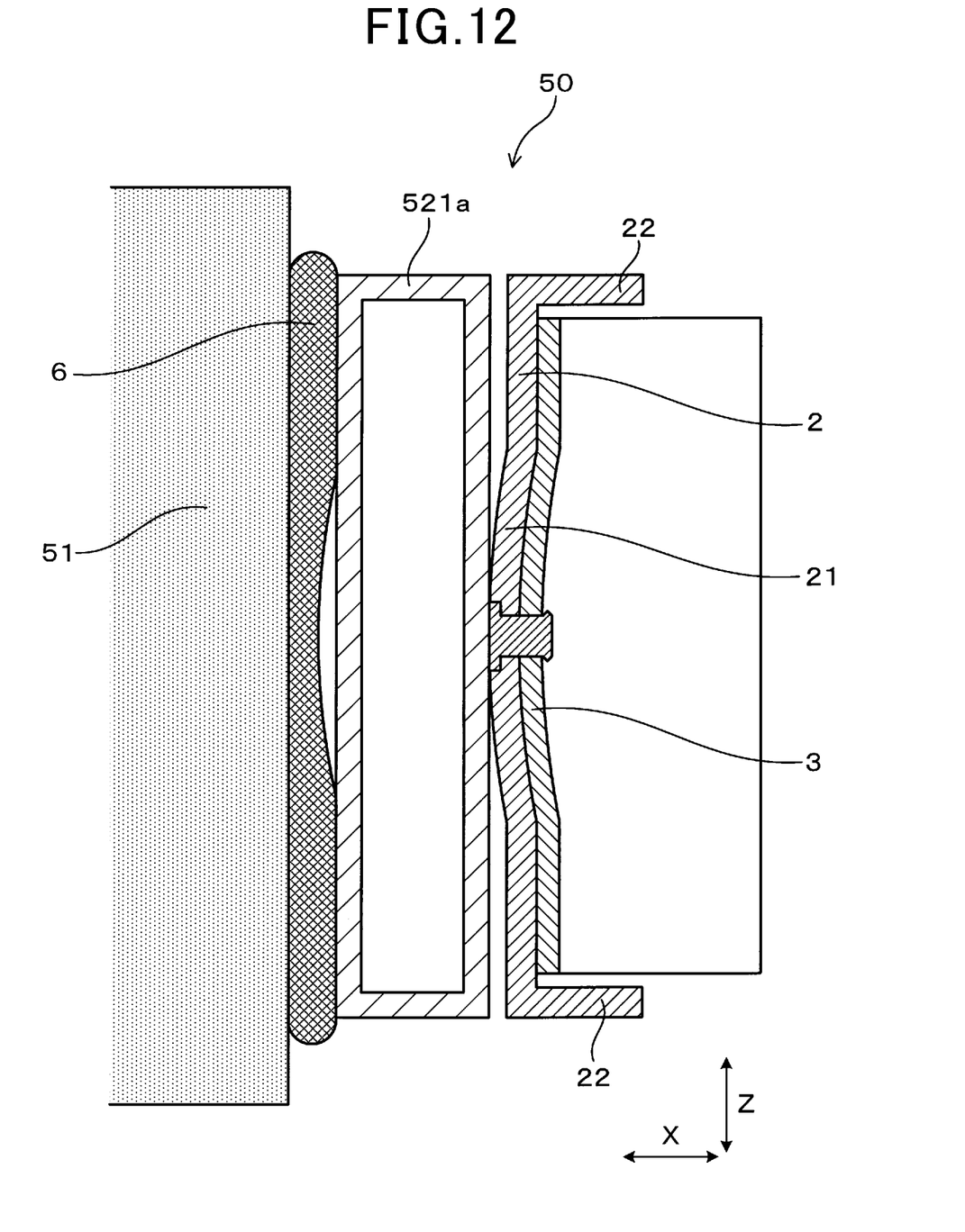
FIG. 12 is a cross-sectional view of the power conversion apparatus in the comparative example, which is an enlarged view of a part of the cross-section sectioned along a direction orthogonal to the Y-direction.

On the other hand, as shown in FIGS. 11 and 12, unlike the present embodiment, in the case where the inner plate surface 211 of the contact plate section 21 does not have a concave surface, as shown in FIG. 11, the elastic member 3 contacts with inner plate surface 21 of the contact plate portion 21 at the entire portion of the elastic member 3 in the Z direction. Here, in the contact plate portion 21, both end portions in the Z direction are located close to the plate ribs 22, and have relatively high rigidity because the rib plate portion 22 reinforces them. On the other hand, the center portion of the contact plate portion 21 in the z direction is apart from the plate ribs 22, and has relatively low rigidity. Accordingly, in the case where the elastic member 3 presses the inner plate surface 211 of the contact plate section 21 at the entire portion of the elastic member 3, the center portion in the Z direction of the contact plate section 21 having low rigidity is likely to be plastic-deformed.

Figure 10:
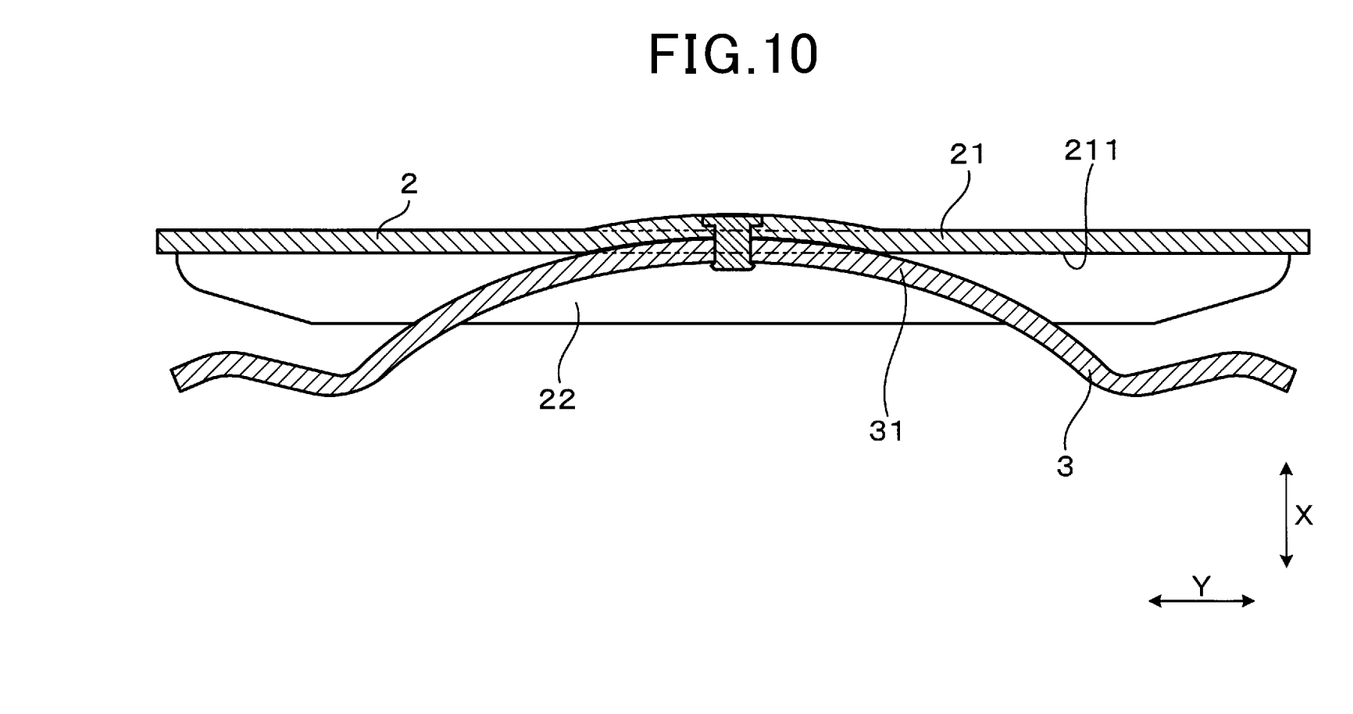
FIG. 10 is a cross-sectional view corresponding to FIG. 4 in a comparative example, which is sectioned along a plane orthogonal to the Z-direction of a pressing member.

Further, as shown in FIG. 10, according to the present embodiment, since the pressing portion 31 of the elastic member 3 contacts with the center portion of the contact plate section 21 in the Y direction, the above-mentioned deformation occurs at the center portion 21 in the Y direction. As shown in FIGS. 10 and 11, outer shapes of the elastic member 3 and the plate 2 before deformation are indicated by two-dot chain line.

In the case where a deformation occurs at the above-described contact plate section 21, as shown in FIG. 12, the contact plate section 21 contacts with the rear surface of the rear cooling pipe 521a of the fixed unit 50 only at a portion that protrudes towards the front side due to the deformation. As a result, since the entire fixed unit 50 cannot be pressed equally, a deviation may occur in the cooling function of the semiconductor module 51.

Further, deviation of the pressing force of the pressing member 1 in the fixed unit 50 may cause a deviation of the thickness of the grease 6 provided between the semiconductor module 51 and the cooling pipe 521. In other words, a portion in the grease 6 overlapping with a portion where the pressing member 1 presses the fixed unit 50 in the X direction is likely to be influenced by the pressing force of the pressing member 1 and more likely to be expanded. On the other hand, for a portion not overlapping with the portion where the pressing member 1 presses the fixed unit 50 in the X direction, it is unlikely to be influenced by the pressing force of the pressing member 1 and is difficult to be expanded. Hence, the thickness of the grease 6 cannot be uniform in a direction orthogonal to the X direction, which may cause degradation of thermal conductivity between the cooling pipe 521 and the semiconductor module 51. According to the present embodiment, deformation of the plate is suppressed, thereby solving the above-mentioned problems.

Also, the plate ribs 22 stand towards X direction from both sides of the contact plate section in the Z direction. Hence, the rigidity of the entire contact plate section 21 can be enhanced. The concave surface 211a is formed at a portion apart from the respective plate ribs 22. Therefore, a portion having relatively low rigidity in the contact plate section 21 can be prevented from being applied with force of the elastic member 3. As a result, deformation of the pressing member 1 can be suppressed.

Further, the concave surface 211a is formed at least at a center location in the Y direction of the inner plate surface 211 in the contact region R. In the contact region R, the center portion of the inner surface 211 in the Y direction is at the furthest position with respect to the plate ribs 22, where the rigidity is likely to be weakened. The concave surface 211a is provided at the above-described portion, whereby the deformation of the contact plate section 21 can be effectively suppressed.

Also, the concave portion 211a is formed to protrude towards both sides of the contact region R in the Y direction. Hence, the elastic member 3 can be reliably prevented from contacting with a portion apart from the plate ribs 22 in the contact plate section 21.

As described, according to the present embodiment, a pressing member capable of suppressing deformation of the plate can be provided.

The present disclosure is not limited to the above-described embodiments. However, the present disclosure can be modified in various manner within the technical scope of the present disclosure.

For example, according to the above-described embodiments, electronic components stuck with the cooling pipes in the fixed unit are semiconductor modules. However, electronic components included in the fixed unit may further include capacitors or reactors which constitute the power conversion circuit, other than the semiconductor modules.

Further, according to the above-described embodiments, the elastic member is composed of a plate spring. However, other elastic members such as a coil spring can be employed.

CONCLUSION

Embodiments of the present disclosure is described so far.

One aspect of the present disclosure is a pressing member (1) pressing a fixed unit (50), where an electronic component (51) constituting a part of a power conversion circuit and a cooling pipe (521) cooling the electronic component are alternately disposed, in a fixed direction (X) of the fixed unit. The pressing member includes: a plate (2) including a contact plate section (21) that faces an end surface of the fixed unit in the fixed direction and contacts with the end surface of the fixed unit, and plate ribs (22) standing in the fixed direction from an end portion of the contact plate section in a width direction (Z) of the contact plate section; and an elastic member (3) disposed in a side of the plate opposite to a side of the plate where the fixed unit is disposed, the elastic member pressing the plate towards a fixed unit side in the fixed direction.

The contact plate section has an inner plate surface (211) as a surface of an elastic member side of the contact plate section. The inner plate surface includes a concave surface (211*a*) that faces the elastic member in the fixed direction with a gap therebetween. Further, the concave surface is formed at a portion apart from the plate ribs in a contact region (R) positioned between the contact plate section and the elastic member in a longitudinal direction (Y) of the contact plate.

In the above-described aspect, the inner plate surface of the contact plate section is formed at a portion apart from the plate rib portion in the contact region, and has a concave surface that faces the elastic member via a gap therebetween. Thus, a portion apart from the plate ribs in the contact plate section, that is, a portion having relatively low rigidity in the contact plate section, can be prevented from being affected by the pressing force of the elastic member. Hence, deformation of the plate can be suppressed.

According to the present disclosure, a pressing member capable of suppressing deformation of the plate can be provided.

What is claimed is:

1. A pressing member pressing a fixed unit, where an electronic component constituting a part of a power conversion circuit and a cooling pipe cooling the electronic component are alternately disposed, in a fixed direction of the fixed unit, the pressing member comprising:

a plate including a contact plate section that faces an end surface of the fixed unit in the fixed direction and contacts with the end surface of the fixed unit, and plate ribs standing in the fixed direction from an end portion of the contact plate section in a width direction of the contact plate section; and an elastic member disposed in a side of the plate opposite to a side of the plate where the fixed unit is disposed, the elastic member pressing the plate towards a fixed unit side in the fixed direction, wherein the contact plate section has an inner plate surface as a surface of an elastic member side of the contact plate section;

the inner plate surface includes a concave surface that faces the elastic member in the fixed direction with a gap therebetween; and the concave surface is formed at a portion apart from the plate ribs in a contact region positioned between the contact plate section and the elastic member in a longitudinal direction of the contact plate.

2. The pressing member according to claim 1, wherein the plate ribs stand in the fixed direction from both sides of the contact plate section in the width direction; and the concave surface is formed at a portion apart from each plate rib.

3. The pressing member according to claim 2, wherein the concave surface is formed at least at a center location of the inner plate surface in the width direction in the contact region.

4. The pressing member according to claim 1, wherein the concave surface is formed to extend outward from the contact region in both longitudinal directions.

\* \* \* \* \*